US012561495B2

(12) United States Patent
Field et al.

(10) Patent No.: US 12,561,495 B2
(45) Date of Patent: Feb. 24, 2026

(54) DIGITAL TWIN SERVICE FOR A FIRE SYSTEM

(71) Applicant: Siemens Industry, Inc., Alpharetta, GA (US)

(72) Inventors: Leslie A. Field, Fair Lawn, NJ (US); William C. Hookway, III, Sparta, NJ (US); Sharad Kundalik Wagh, Pune (IN); Sumit Surwase, Pune (IN); Sanyukta Tiwari, Nagpur (IN); Pranav Deshmane, Pune (IN)

(73) Assignee: Siemens Industry, Inc., Alpharetta, GA (US)

( * ) Notice: Subject to any disclaimer, the term of this patent is extended or adjusted under 35 U.S.C. 154(b) by 944 days.

(21) Appl. No.: 17/826,232

(22) Filed: May 27, 2022

(65) Prior Publication Data

US 2023/0385478 A1     Nov. 30, 2023

(51) Int. Cl.
*G06F 30/20*          (2020.01)

(52) U.S. Cl.
CPC .................................. *G06F 30/20* (2020.01)

(58) Field of Classification Search
CPC ........ G06F 30/20; G08B 29/145; G08B 29/12
See application file for complete search history.

(56) References Cited

U.S. PATENT DOCUMENTS

| | | | |
|---|---|---|---|
| 6,907,300 | B2 | 6/2005 | Omahoney et al. |
| 10,419,243 | B2 | 9/2019 | Schubert et al. |
| 10,528,016 | B2 | 1/2020 | Noboa |
| 2008/0262816 | A1* | 10/2008 | Lontka .................... G06F 30/20 |
| | | | 703/13 |
| 2012/0158185 | A1 | 6/2012 | El-Mankabady et al. |
| 2015/0246727 | A1 | 9/2015 | Masticola et al. |
| 2016/0327296 | A1 | 11/2016 | Leising et al. |
| 2018/0067635 | A1 | 3/2018 | Zummo |
| 2018/0075712 | A1 | 3/2018 | Field |
| 2018/0113682 | A1 | 4/2018 | Horvath et al. |
| 2018/0164993 | A1 | 6/2018 | Zummo et al. |
| 2018/0224144 | A1 | 8/2018 | Noboa et al. |
| 2018/0341755 | A1 | 11/2018 | Aschauer et al. |
| 2019/0370421 | A1* | 12/2019 | Nalukurthy .......... G08B 29/145 |
| 2020/0092127 | A1 | 3/2020 | Park et al. |
| 2020/0400330 | A1 | 12/2020 | Przybylski et al. |
| 2021/0081811 | A1 | 3/2021 | Brown et al. |
| 2021/0200910 | A1 | 7/2021 | Fernandez-orellana et al. |
| 2021/0201635 | A1 | 7/2021 | Fernandez-orellana et al. |

(Continued)

OTHER PUBLICATIONS

Anonymous: "User instructions Mimic Configuration Tool for Mimic Panels", Aug. 31, 2008 (Aug. 31, 2008), pp. 1-24, XP055723492, Retrieved from the Internet: URL:http://gentexpert.co.uk/downloads/Addressable/Loop_Devices/A3_mimic/Mimic%20Config%20tool.pdf.

(Continued)

*Primary Examiner* — Chuen-Meei Gan

(57)          ABSTRACT

For service to a fire safety system, all or part of the fire safety system is simulated. This virtual representation may be used with an installed panel or firmware for an actual panel to be installed. The simulation allows for the design, testing, troubleshooting, training, or other activities for design, installation, or remediation of the first safety system. Delays, complexity, and/or difficulty may be reduced using the virtual representation of at least part of the fire safety system.

18 Claims, 15 Drawing Sheets

(56) References Cited

U.S. PATENT DOCUMENTS

| | | | |
|---|---|---|---|
| 2021/0224433 A1 | 7/2021 | Fernandez-orellana et al. | |
| 2021/0240875 A1 | 8/2021 | Fernandez-orellana et al. | |
| 2021/0248280 A1 | 8/2021 | Fernandez-orellana et al. | |
| 2021/0248281 A1 | 8/2021 | Fernandez-orellana et al. | |
| 2021/0248282 A1 | 8/2021 | Fernandez-orellana et al. | |
| 2021/0256173 A1 | 8/2021 | Fernandez-orellana et al. | |
| 2021/0322806 A1 | 10/2021 | Fernandez-orellana et al. | |
| 2023/0229418 A1* | 7/2023 | Mahendrakar ...... | G06F 11/3692 |
| | | | 717/170 |

OTHER PUBLICATIONS

SkyTop Technologies Ltd. "What is Fire Safety Simulation?" Retrieved Mar. 28, 2022 https://www.skytoptechnologies.com/consultancy/fire-safety-simulation-system.

* cited by examiner

| 1:4 :ZIC-4A | | | | ⚠ 🔒 ⬈ ⊠ |

|  | ZONES | | | |
| --- | --- | --- | --- | --- |
|  | 1 | 2 | 3 | 4 |
| Usage: | NAC | | | |
| Zone Code Active: | | | | |
| Custom I Setting | - | - | - | - |
| Disable Degrade: | Y | N | N | N |
| Silenceable: | Y | Y | Y | Y |
| Class: | B | B | B | B |
| Short: | ▨ | ▨ | ▨ | ▨ |
| Open: | ▨ | ▨ | ▨ | ▨ |
| I Lmt Ckt Fail: | ▨ | ▨ | ▨ | ▨ |
| Input V Fail: | ▨ | ▨ | ▨ | ▨ |
| Class A Fault: | ▨ | ▨ | ▨ | ▨ |
| A/B Relay Active: | ▨ | ▨ | ▨ | ▨ |
| Overcurrrent: | ▨ | ▨ | ▨ | ▨ |

◎ RESET
○ POWER
○ CARD FAIL
○ CAN FAIL
○ HNET FAIL
○ GND FAULT
○ ZONE 1 ACTIVE
○          TRBL
○ ZONE 2 ACTIVE
○          TRBL
○ ZONE 3 ACTIVE
○          TRBL
○ ZONE 4 ACTIVE
○          TRBL

Figures 10, 10A:
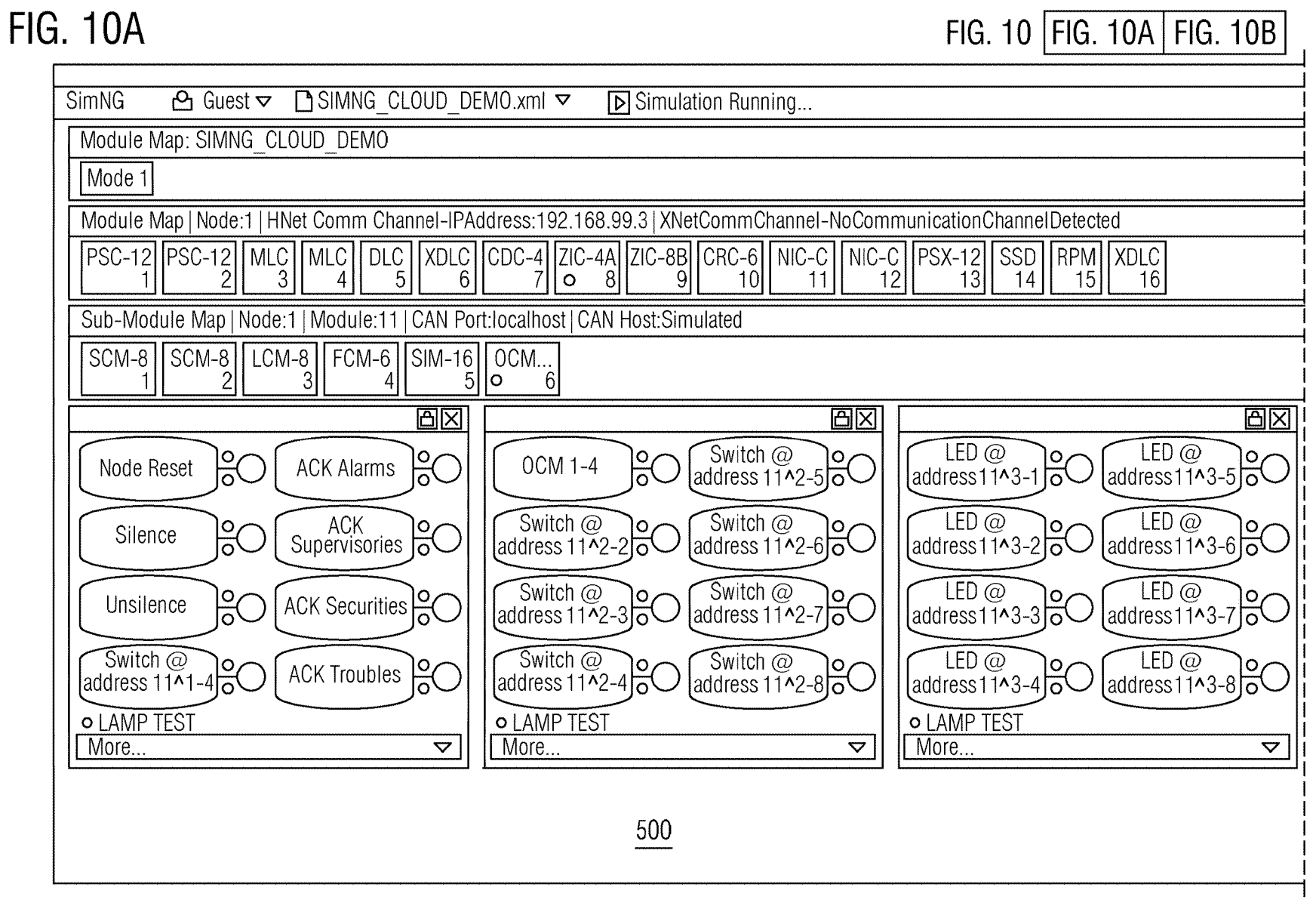

SimNG    Guest ▾    SIMNG_CLOUD_DEMO.xml ▾    Simulation Running....

Module Map: SIMNG_CLOUD_DEMO

Mode 1

Module Map | Node:1 | HNet Comm Channel–IPAddress:192.168.99.3 | XNetCommChannel–NoCommunicationChannelDetected

| PSC-12 1 | PSC-12 2 | MLC 3 | MLC 4 | DLC 5 | XDLC 6 | CDC-4 7 | ZIC-4A ○ 8 | ZIC-8B 9 | CRC-6 10 | NIC-C 11 | NIC-C 12 | PSX-12 13 | SSD 14 | RPM 15 | XDLC 16 |

Sub-Module Map | Node:1 | Module:11 | CAN Port:localhost | CAN Host:Simulated

| SCM-8 1 | SCM-8 2 | LCM-8 3 | FCM-6 4 | SIM-16 5 | OCM... ○ 6 |

Node Reset    ACK Alarms

Silence    ACK Supervisories

Unsilence    ACK Securities

Switch @ address 11^1-4    ACK Troubles

○ LAMP TEST  ▷

More...

OCM 1-4    Switch @ address 11^2-5

Switch @ address 11^2-2    Switch @ address 11^2-6

Switch @ address 11^2-3    Switch @ address 11^2-7

Switch @ address 11^2-4    Switch @ address 11^2-8

○ LAMP TEST  ▷

More...

LED @ address11^3-1    LED @ address11^3-5

LED @ address11^3-2    LED @ address11^3-6

LED @ address11^3-3    LED @ address11^3-7

LED @ address11^3-4    LED @ address11^3-8

○ LAMP TEST  ▷

More...

Figure 11:
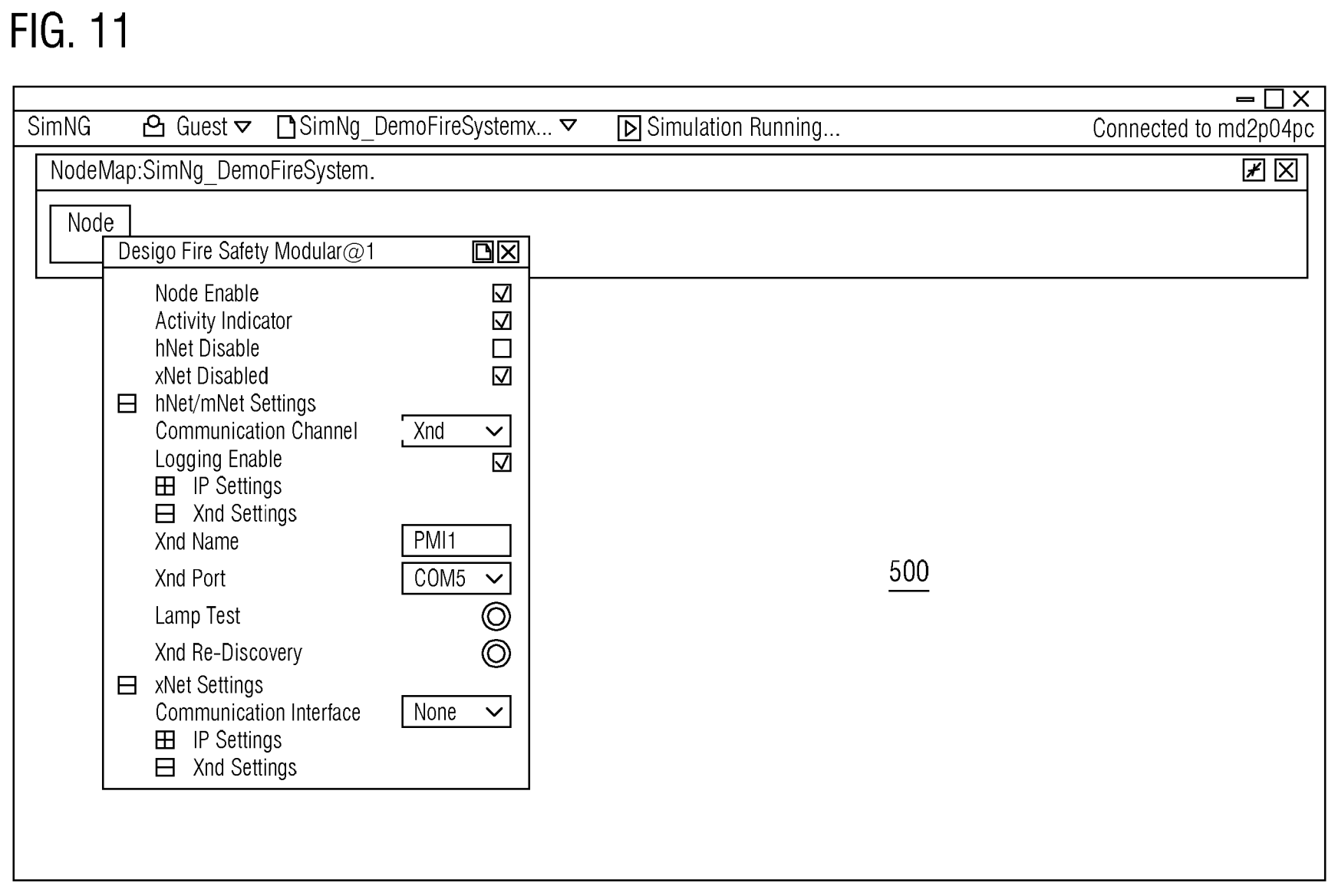

SimNG

Guest ▽    SimNg_DemoFireSystemx...    ▽    Simulation Running...    Connected to md2p04pc    — □ ✕

NodeMap:SimNg_DemoFireSystem.

Node

Desigo Fire Safety Modular@1

Node Enable          ☑
Activity Indicator   ☑
hNet Disable         ☐
xNet Disabled        ☑
hNet/mNet Settings
Communication Channel    Xnd     ⌄
Logging Enable           ☑
  IP Settings
  Xnd Settings
Xnd Name                 PMI1
Xnd Port                 COM5    ⌄
Lamp Test                ◎
Xnd Re-Discovery         ◎
xNet Settings
Communication Interface  None    ⌄
  IP Settings
  Xnd Settings

Figures 13, 13A:
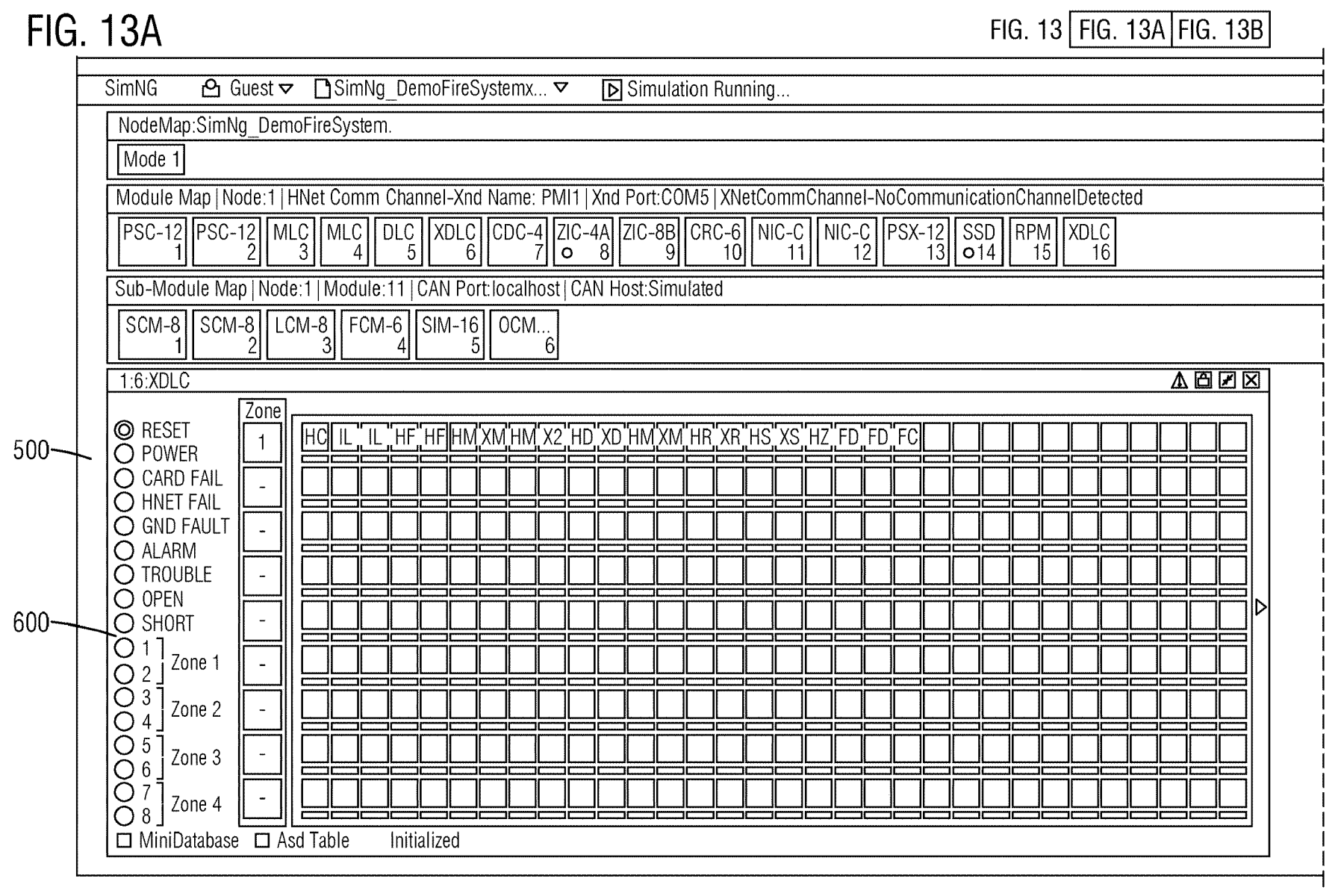

SimNG ⌂ Guest ▷ ☐SimNg_DemoFireSystemx... ▷ ⚠ Simulation Running....

NodeMap:SimNg_DemoFireSystem.

Mode 1

Module Map | Node:1 | HNet Comm Channel-Xnd Name: PMI 1 | Xnd Port:COM5 | XNetCommChannel-NoCommunicationChannelDetected

| PSC-12 1 | PSC-12 2 | MLC 3 | MLC 4 | DLC 5 | XDLC 6 | CDC-4 7 | ZIC-4A ○ 8 | ZIC-8B 9 | CRC-6 10 | NIC-C 11 | NIC-C 12 | PSX-12 13 | SSD ○14 | RPM 15 | XDLC 16 |

Sub-Module Map | Node:1 | Module:11 | CAN Port:localhost | CAN Host:Simulated

| SCM-8 1 | SCM-8 2 | LCM-8 3 | FCM-6 4 | SIM-16 5 | OCM... 6 |

1:6:XDLC

Zone

◎ RESET        1
○ POWER        -
○ CARD FAIL    -
○ HNET FAIL    -
○ GND FAULT    -
○ ALARM        -
○ TROUBLE      -
○ OPEN         -
○ SHORT        -
○ 1 Zone 1
○ 2
○ 3
○ 4 Zone 2
○ 5
○ 6 Zone 3
○ 7
○ 8 Zone 4

☐ MiniDatabase  ☐ Asd Table    Initialized

Figure 13B:
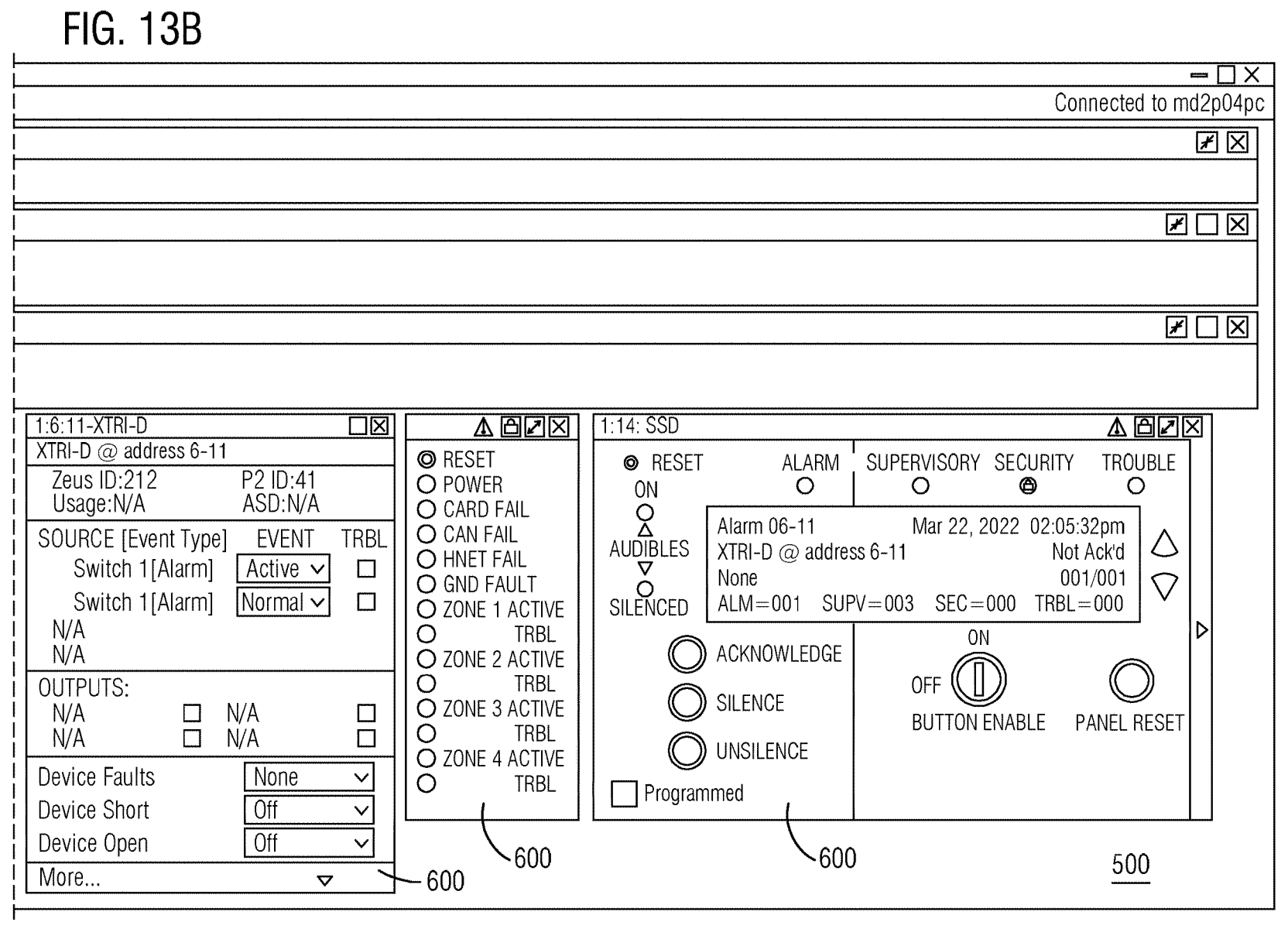

Connected to md2p04pc

1:6:11-XTRI-D
XTRI-D @ address 6-11

| | |
|---|---|
| Zeus ID:212 | P2 ID:41 |
| Usage:N/A | ASD:N/A |

SOURCE [Event Type]    EVENT    TRBL
Switch 1 [Alarm]    Active ∨    ☐
Switch 1 [Alarm]    Normal ∨    ☐
N/A
N/A

OUTPUTS:
N/A    N/A    ☐   ☐
N/A    N/A    ☐   ☐

Device Faults    None ∨
Device Short    Off ∨
Device Open    Off ∨
More...

600

1:14: SSD

◉ RESET    ALARM    SUPERVISORY    SECURITY    TROUBLE
ON    ○    ○    ⊕    ○
AUDIBLES ▷
SILENCED ○

Alarm 06-11
XTRI-D @ address 6-11
None
ALM=001   SUPV=003   SEC=000   TRBL=000

Mar 22, 2022 02:05:32pm
Not Ack'd
001/001

○ ACKNOWLEDGE
○ SILENCE
○ UNSILENCE

OFF / ON
BUTTON ENABLE    PANEL RESET

☐ Programmed

600

◎ RESET
○ POWER
○ CARD FAIL
○ CAN FAIL
○ HNET FAIL
○ GND FAULT
○ ZONE 1 ACTIVE
○      TRBL
○ ZONE 2 ACTIVE
○      TRBL
○ ZONE 3 ACTIVE
○      TRBL
○ ZONE 4 ACTIVE
○      TRBL

600

500

Load Configuration of Fire Safety System —1402

Simulate Interaction —1404

Simulate Stimulus —1406

Simulate Response —1408

Output Results of Simulation —1410

DIGITAL TWIN SERVICE FOR A FIRE SYSTEM

BACKGROUND

The present embodiments relate to fire safety systems. Fire safety systems may include fire alarm control panels connected with or coupled to other fire alarm equipment over one or more communication channels or networks. The fire safety systems may be quite complex, covering large spaces and/or many rooms or floors. For example, a fire safety system for a multi-level building may be installed floor-by-floor. The system may operate for most floors but have load balancing problems when later floors are installed and added to the entire system. The installation and testing of such systems typically occur late in the building process. As a result, any delays due to problems in design, logic, connections, or intra-operability of components may introduce undesirable delay. Testing of installed systems may be difficult given occupancy of the building.

SUMMARY

Arrangements, systems, methods, and non-transitory computer readable media are provided for service to a fire safety system. All or part of the fire safety system is simulated. This virtual representation may be used with an installed panel or firmware for an actual panel to be installed. The simulation allows for the design, testing, troubleshooting, training, or other activities for design, installation, or remediation of the first safety system. Delays, complexity, and/or difficulty may be reduced using the virtual representation of at least part of the fire safety system.

In a first aspect, an arrangement is provided for service to a fire safety system. A memory is configured to store a configuration of the fire safety system. The configuration of the fire safety system including a panel and one or more components. A processor is configured to simulate communication of the one or more components. The execution of firmware of the panel includes handling of the simulated communication by the panel. A display is configured to display the handling of the communication.

In one embodiment, the firmware for the panel is firmware operable on hardware of the panel as installed. The communication of the one or more components is simulated without operation of firmware for the one or more components.

In another embodiment, the processor is configured to execute the firmware without hardware of the panel. All the fire safety system is represented in the simulation. For example, the processor is configured to load the configuration where the simulation is a test of the configuration including logic for operation of the fire safety system.

As another embodiment, the panel is configured to execute the firmware. For example, the fire safety system includes the panel, cards, detectors, and output devices installed in a building. The one or more components are the cards, the detectors, and the output devices as well as at least one component not installed in the building. The simulation is for the at least one component not installed.

In yet another embodiment, the configuration of the fire safety system is a design configuration from fire safety system configuration software.

As an embodiment, the processor is configured to cause display on the display of one or more graphic user interfaces of the one or more components, respectively, in the simulation. The graphic user interfaces represent the communication.

An embodiment uses a cloud server as the processor. The display is remote from the cloud server.

In various embodiments: the processor is configured to simulate the communication based on logs of installed parts of the fire safety system, the simulation is for the one or more components that are unavailable for installation, and/or the simulation is of communication corresponding to a hardware fault.

In another embodiment, the simulation includes a network of the fire safety system.

In a second aspect, a fire safety system includes a panel installed in a building and executing panel firmware. First components are installed in the building and connected with the panel. A processor is configured to simulate one or more second components not installed in the building. The panel operates in response to the first components and in response to the simulation of the one or more second components.

According to one embodiment, the processor comprises a cloud server. In another embodiment, the panel operates as if the one or more second components are installed due to the simulation.

In a third aspect, a method is provided for testing a fire safety system. A configuration of the fire safety system is loaded. Interaction between parts of the first safety system is simulated based on the configuration. Results of the simulating are output.

In an embodiment, the simulating includes simulating with firmware of a panel of the fire safety system as one of the parts and communications of others of the parts where an entirety of the fire safety system is represented virtually. The results are output as representations of graphic user interfaces of the other parts.

According to one embodiment, a panel of the fire safety system is installed in a building. The panel is one of the parts. The simulation includes simulating communications from other parts with the panel. The results are output on the panel.

In another embodiment, the simulation is part of automatically testing the configuration.

Any one or more of the aspects described above may be used alone or in combination. These and other aspects, features and advantages will become apparent from the following detailed description of preferred embodiments, which is to be read in connection with the accompanying drawings. The present invention is defined by the following claims, and nothing in this section should be taken as a limitation on those claims. Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the embodiments. Moreover, in the figures, like reference numerals designate corresponding parts throughout the different views.

FIG. 7 shows one embodiment of a display for a simulated network card of a fire safety system;

FIG. 8 shows one embodiment of a display for a simulated Zone Indicating Card (Output) module of a fire safety system;

FIGS. 9-13 (including FIGS. 9A-B, 10A-B, 12A-B, and 13A-B) show embodiments of graphics user interfaces for the simulator.

DETAILED DESCRIPTION OF EMBODIMENTS

A virtual simulation (digital twin) of at least some of a fire panel, its peripherals, and networks is provided. For example, a simulation in a cloud environment or computer separate from the fire safety system is provided. The simulation may be run in a local computer or remotely, such as an edge application. In one embodiment, the digital twin system is automatically setup through parsing a fire safety system configuration file. Web access allows monitoring and operating of the digital twin system or simulation. The simulation may interact with installed hardware of the fire safety system, allowing operation of the complete or entire fire safety system even where some hardware is not running or installed.

Applications of the simulation range from sales and training to aiding with development, debugging, installation (e.g., using the mix of installed hardware and virtual components), and testing the fire safety system at scale. Further examples include: demonstrating operation of the fire system using a cloud application as a customer sales tool; providing operational proof of concept for large scale systems (scalability) without the required hardware; utilizing the digital twin of the fire system to work with an approving authority for logic approval prior to installation; allowing installers to pre-test configuration logic and debug resulting in a validated configuration before any hardware is installed; using a partial installation (hybrid configuration) of a fire safety system where missing components (nodes, modules, sub-modules) link from the cloud services using the simulation to the installed components (e.g., the cloud can simulate all modules and components, as hardware is installed the real system under test will not display faults for missing hardware); automating testing (automatic testing interface—ATI) with built-in normal operation testing; "playback" logs from a customer site or fire safety system via the cloud to support technical support teams in reproducing bugs and providing the ability of faster high quality field support; providing "hands on" operational training of the fire system in either a classroom or a remote learning environment without the required hardware; simulating operation of a product that is no longer in production or unavailable; providing a virtual research and development environment for product development; simulating faults that are either extremely difficult or impossible on physical hardware (e.g., shorts or open circuits that may otherwise require damage to hardware); and/or shortening initialization times, allowing faster startup times thereby reducing the time required for operational system verification. Other uses include pre-acceptance of customer installation by an authority having jurisdiction, user training, customer support without having to send a technician to a site and with quick turn-around, installation and debugging on site, pre-testing configurations, and/or as a sales tool.

Figure 1:
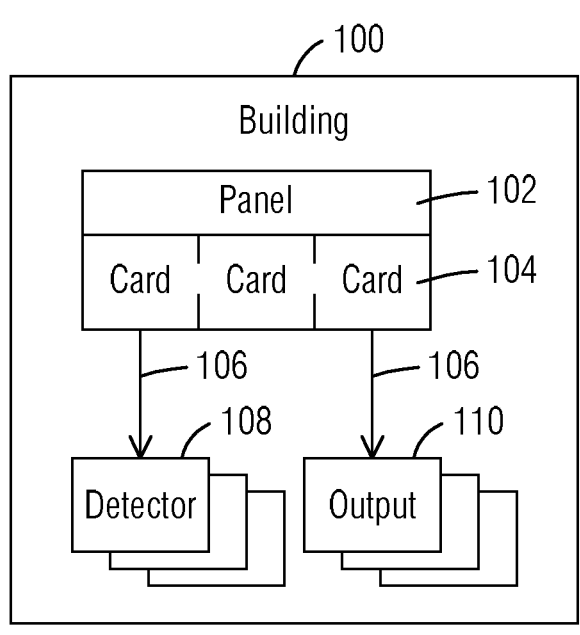
FIG. 1 shows a block diagram of one embodiment of a fire safety network installed in a building.

FIG. 1 shows one embodiment of a fire safety system. This embodiment is a simplified example of the fire safety system as installed in the building 100. The fire safety system may be for part of the building, an entire building over one or more floors, and/or across multiple buildings. The building includes separate spaces, rooms, and/or floors, many, or all of which include one or more parts of the fire safety system.

Various configurations using different types and numbers of panels 102, cards 104, detectors 108, and/or outputs 110 may be planned or provided. Other types of components (nodes, modules, sub-modules, peripherals, and/or other fire safety system components) may be provided, such as intercoms and/or switches. The fire safety system is represented in a simple manner to better discuss the simulation, virtual representation, or digital twin to improve design, configuration, testing, installation, troubleshooting, and/or activity before, during, or after installation.

The fire safety system includes one panel 102, but multiple panels may be provided (e.g., single node or multiple node system). Any panel for controlling operation of a section, part, or all the fire safety system may be provided. In general, the panel 102 hosts cards 104 for linking with a computer, computer network, sub-modules, peripherals, and/or other parts of the fire safety system. The panel 102 may include a graphics user interface or display and input for monitoring and/or control of the fire safety system. The panel 102 includes one or more processors that operate by executing firmware specifically designed for the panel 102.

Any number of cards 104 may be provided. The cards 104 may connect directly with the panel 102 or be located outside the panel and connect wirelessly or wired with the panel 102. The cards 104 include circuits for networking, monitoring, output, and/or control of other components (e.g., sub-modules, detectors 108, outputs 110, or other peripherals). Using wired and/or wireless connections with or without networking protocols of networks 106 established by the cards 106, the cards 104 may manage communications to and from peripherals and the panel 102. For example, one card 106 operates as a CAN-bus, another card 104 establishes a proprietary communications network, and yet another card 104 provides for ethernet connections and communications. Some example cards include power supply, legacy detector line card, detector line card, conventional detector card, zone indicating card, controllable relay module, network interface card, voice control card, system status display, and remote printer module. Other cards may be provided.

Sub-modules may be provided, such as components that connect between the cards 104 and the peripherals 108, 110. Example sub-modules include switch control module, LED control module, live page board, fan control module, supervised input module, output control module, amplifier, telephone zone card, firefighters master telephone, and/or live voice module. Other sub-modules may be provided.

Any number of peripherals, such as the detectors 108 and outputs 110 may be provided. The detectors 108 are smoke or gas detectors. Pull-switch or manual detectors 108 may be included. The outputs 110 are sprinklers, strobes, speakers, intercoms, and/or other outputs of the fire safety system. Other peripherals include fans, baffles, or other components for interacting with and/or controlling heating, air conditioning, and/or ventilation. Some example peripherals include series detectors, remote NAC control points, manual pull stations, conventional zone module, indicator LED, quad input, relay output, optical detector, dual optical/thermal detector, dual optical/thermal detector/CO detector, heat detector, CO detector, and/or thermal detector. Other peripherals may be provided.

Figure 2:
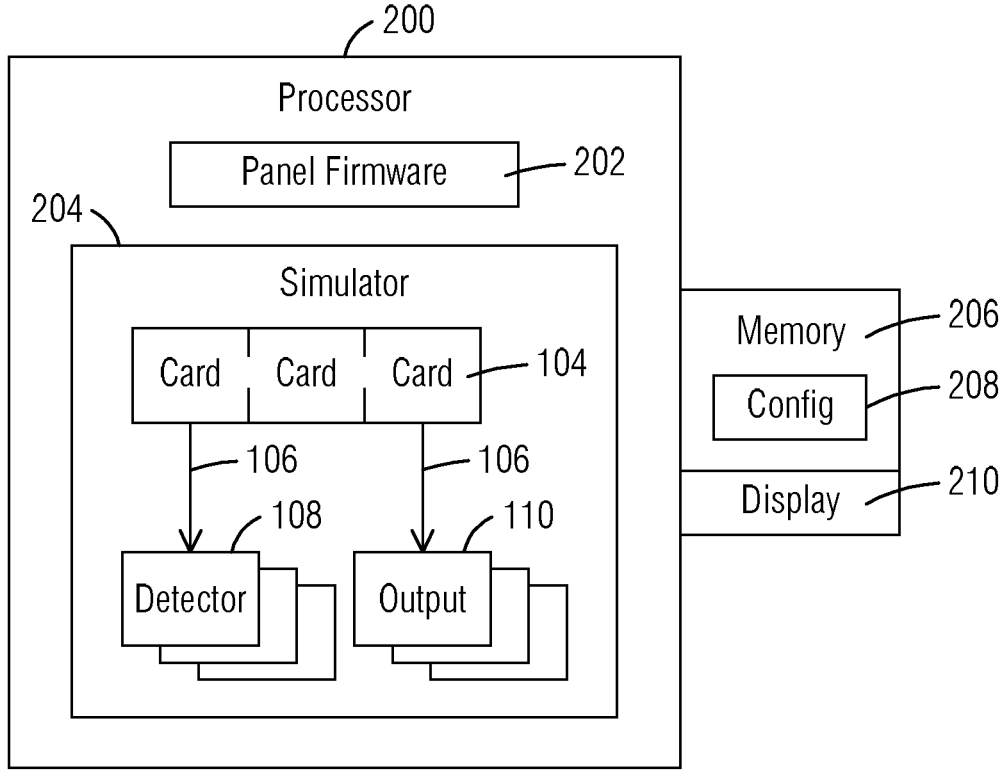
FIG. 2 shows one embodiment of simulation of a fire safety system with a digital twin of the entire fire safety system.
Figure 3:
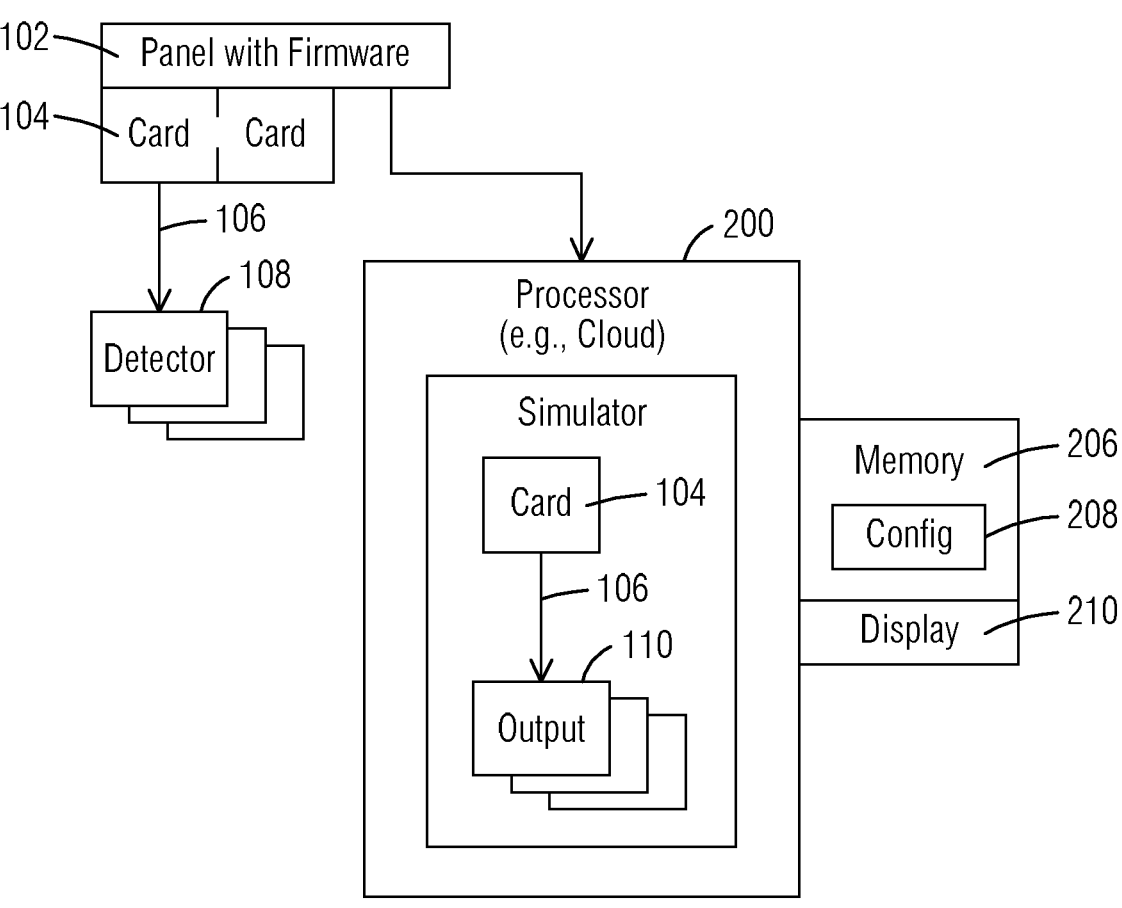
FIG. 3 shows one embodiment of a combination of installed parts of the fire safety system with simulated parts.

FIGS. 2 and 3 show different embodiments of an arrangement for service to a fire safety system. The service includes simulation of all or part of the fire safety system. FIG. 2 shows simulation of the entire fire safety system. FIG. 3 shows simulation of part of the fire safety system where the rest of the fire safety system is provided by actual hardware, such as installed components.

The arrangements include a processor 200, a memory 206, and a display 210, with or without any fire safety system hardware (e.g., panel 102, cards 104, network 106, and/or peripherals). Additional, different, or fewer components may be provided. For example, the Internet, another computer network, a database, and/or other processors may be included. As another example, a graphics user interface or input devices are included.

The memory 206 is a random-access memory, hard drive, cache, solid state, removable (e.g., disk or solid-state drive), or other physical medium for storing data. The memory 206 or another memory may store instructions, which are executable by the processor 200. The instructions on the non-transitory memory 206 are for loading, simulating, interacting with installed hardware, and/or outputting operation or handling information for events from the simulating. The instructions are for implementing the method of FIG. 9 (including FIGS. 9A and 9B) or another method.

In one embodiment, the memory 206 stores the firmware 202 for the panel, simulation models (e.g., communications examples) for the various components to be simulated, firmware for components (communications formats for networks), and/or log files.

The memory 206 is configured to store information for the fire safety system. For example, a configuration 208 of the fire safety system is stored. The configuration provides for the components (e.g., panels 102, cards 104, networks 106, and/or peripherals (e.g., detectors 108 and outputs 110)) as connected together with or without logic to be used. A design or installed fire safety system configuration 208 is loaded into and stored by the memory 206.

In one embodiment, the configuration is formatted as provided by an engineering or design system, such as a "configuration tool" fire system configuration. A design configuration from fire safety system configuration software is stored. For example, the user uploads the configuration from the "configuration tool" to run the system in a virtual environment. In other embodiments, the configuration is formatted as a translation into nodes and links between components for implementation of the simulation.

The processor 200 is a general processor, central processing unit, graphics processing unit, digital signal processor, application specific integrated circuit, tensor processor, field programmable gate array, digital circuit, analog circuit, and/or combinations thereof. The processor 200, based on execution of instructions or as configured by software, firmware, and/or hardware, performs simulation of one or more components of the fire safety system.

Figure 4:
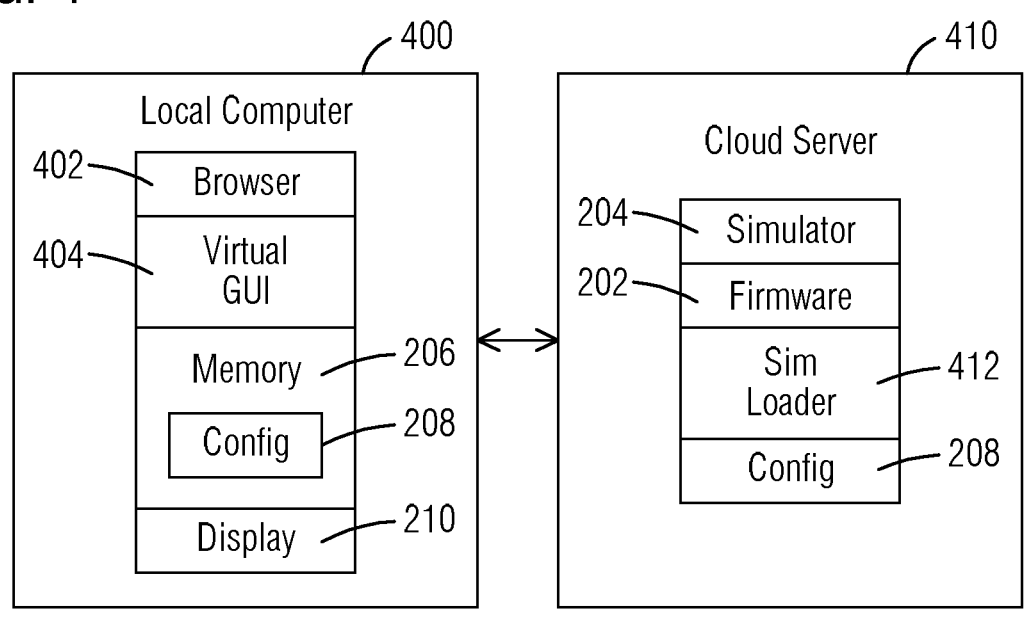
FIG. 4 shows a block diagram of one embodiment of simulation of a fire safety system in the cloud.

In one embodiment, the processor 200 is a server, such as a cloud server. FIG. 4 shows an example. A local computer 400 runs a browser 402, which shows a virtual graphics user interface 404 provided by the cloud server 410. The cloud server 410 connects with the browser 402 of the local computer 400 through one or more computer networks. The cloud server 410 runs the simulator 204 after loading the simulation by the SIM loader 412 based on the configuration 208. In other embodiments, the simulation or simulator 204 is provided in a workstation or computer run locally to the fire safety system (e.g., in the building). In yet another embodiment, the simulation or simulator 204 is provided at a computer remote from the building to house or housing the fire safety system. Rather than relying on a client-server arrangement, the remote computer implements the simulation as well as outputs results on the display of the remote computer. The processor 200 may be run as an edge service.

The processor 200 executes the instructions for the simulator 204, which models the components arranged as provided in the configuration 208. For example, the processor 200 demonstrates operation of the fire system using a cloud APP without any required hardware (FIG. 2) or with interaction with only some hardware (FIG. 3) of the fire safety system. The components, connections, and/or logic provided by the configuration 208 may be tested using the simulator 204. The graphics user interface 404 of the simulator 204, such as provided on the browser 402, allows for interaction with the simulator 204 for testing, debugging, or other operation.

The simulator 204 simulates operation of various components, such as the cards 104, networks 106, detectors 108, and/or outputs 110. The components to simulate and the links or connections are provided by the configuration 208 or separately identified. In one embodiment, the simulator 204 simulates any given component by simulation of communications from or to the component. Rather than simulate the entire operation of the component, just the communications or external transmissions, displays, and/or receipt are simulated. The communication of the one or more components is simulated with or without operation of firmware for the one or more components. The simulator 204 communicates using messages designed for flexibility with a test automation interface, which provides the messages to and/or from the panel firmware 202. In alternative embodiments, the operation including firmware or programming of the components is simulated, such as using the programming or a physics model.

The simulator 204 includes an engine and interfaces, such as a program operating component models with or without interfaces for formatting communications or establishing links with other devices (e.g., installed panel 102). Dynamic resource allocation may be used to host the simulator 204, where the simulated components and/or simulated fire safety systems may be created and deleted on an as needed basis. Open source or other programming may be used.

The processor 200 (FIG. 2) or the panel 102 (FIG. 3) executes firmware 202 of the panel 102. The firmware is the programming, including logic, to be or being implemented by the panel 102. The actual firmware 202 is run separately from the simulator 204. Rather than a full simulation of the panel 102, the actual firmware 202, as configured by the configuration 208, is run by the processor 200, the panel 102, or another processor. The execution of the firmware 202 of the panel 102 includes handling of the simulated communication by the panel 102 (e.g., by the firmware 202). The simulator 204 is communicatively linked with (e.g., through a computer network using TCP/IP or other communications protocol/transport mechanism) the firmware 202. The firmware 202 is operable on hardware of the panel 102 as installed, even if not yet installed.

In the example of FIG. 2, the simulator 204 and the panel firmware 202 are deployed on the same processor 200, such as deployed as a cloud service. The user and/or configuration 208 selects the firmware version to match the configuration 208 as well as configures the simulator 204 to model the various other components. The firmware 202 is executed without the panel 102 (i.e., without the hardware of the panel 102). All the fire safety system is represented in the simulation, with the firmware 202 and the simulator 204 simulating the entire fire safety system. The processor 200 is configured to load the configuration 208. The simulation is a test of the configuration including logic for operation of the fire safety system.

In the example of FIG. 3, the panel 102 is configured to execute the firmware 202. The fire safety system includes the panel 102, cards 104, networks 106, detectors 108, and/or output devices 110 installed in the building 100. One or more components (e.g., cards 104, networks 106, detectors 108, and/or output devices 110) are not installed in the building 100. The simulation is for the components not installed. The panel 102 operates in response to installed components and in response to the simulation of the other components. The panel 102 operates as if one or more uninstalled components are installed due to the simulation. In the example of FIG. 3, the output devices 110, one card 104, and one network 106 for the output devices 110 are not installed and/or are simulated. Other divisions of simulated and installed parts of the fire safety system may be provided. For example, the components for one or more floors are installed, and the components for one or more other floors are not installed. A partial installation (hybrid configuration) of the fire system has the installed components (nodes, modules, sub-modules) link to the simulator 204, such as linking to cloud services using the digital twin. The processor 200 simulates all modules and components not installed. As hardware is installed, the actual hardware may take over operation so that the simulator 204 ceases to simulate that component. Due to the simulation, the real system under test will not display faults for missing hardware as the link to the simulator 204 substitutes for the missing hardware. This reduces diagnostic time because only new hardware related defects introduced during installation will show up as a defect. This allows for phased constructions utilizing a partial digital system to connect to a site in progress.

The display 210 is a display screen, such as a monitor, liquid crystal display, light emitting diode (LED) display, or another computer display. In one embodiment, the display 210 is a panel or component display, such as for actual installed hardware. Alternatively, or additionally, the display 210 is a display of the processor 200 or local computer 400 for interacting with or displaying information from the simulator 204 and/or the firmware 202. For example, the display 210 is a display screen of the local computer 400 remote from the cloud server 410.

The display 210 is configured by loading information (i.e., an image) onto a display plane buffer and outputting the image to the display 210. The processor 200 or another controller (e.g., local computer 400) generates the images to be displayed on the display 210.

The display 210 is configured to display the handling of the communication. The results from the simulation are displayed, such as showing activation of a component or communication and resulting actions in other components of the fire safety system.

In one embodiment, the display 210 shows communications or operation associated with the simulator 204 while installed hardware and/or the display 210 show the effects on the installed hardware. In other embodiments, the display 210 shows both the communications or operation (e.g., stimulus and/or response) for the simulator 204 and the effects on the installed hardware (e.g., panel 102). The panel graphics user interface or display may be represented, or the actual display is used.

The graphics user interfaces represent the communication being simulated. The graphics user interfaces show the installed and/or simulated interfaces as they would appear if installed, but other representations may be used. The look-and-feel of the displayed image mirrors the look-and-feel of the installed hardware of the fire safety system. In other embodiments, the look-and-feel is different.

Figure 5:
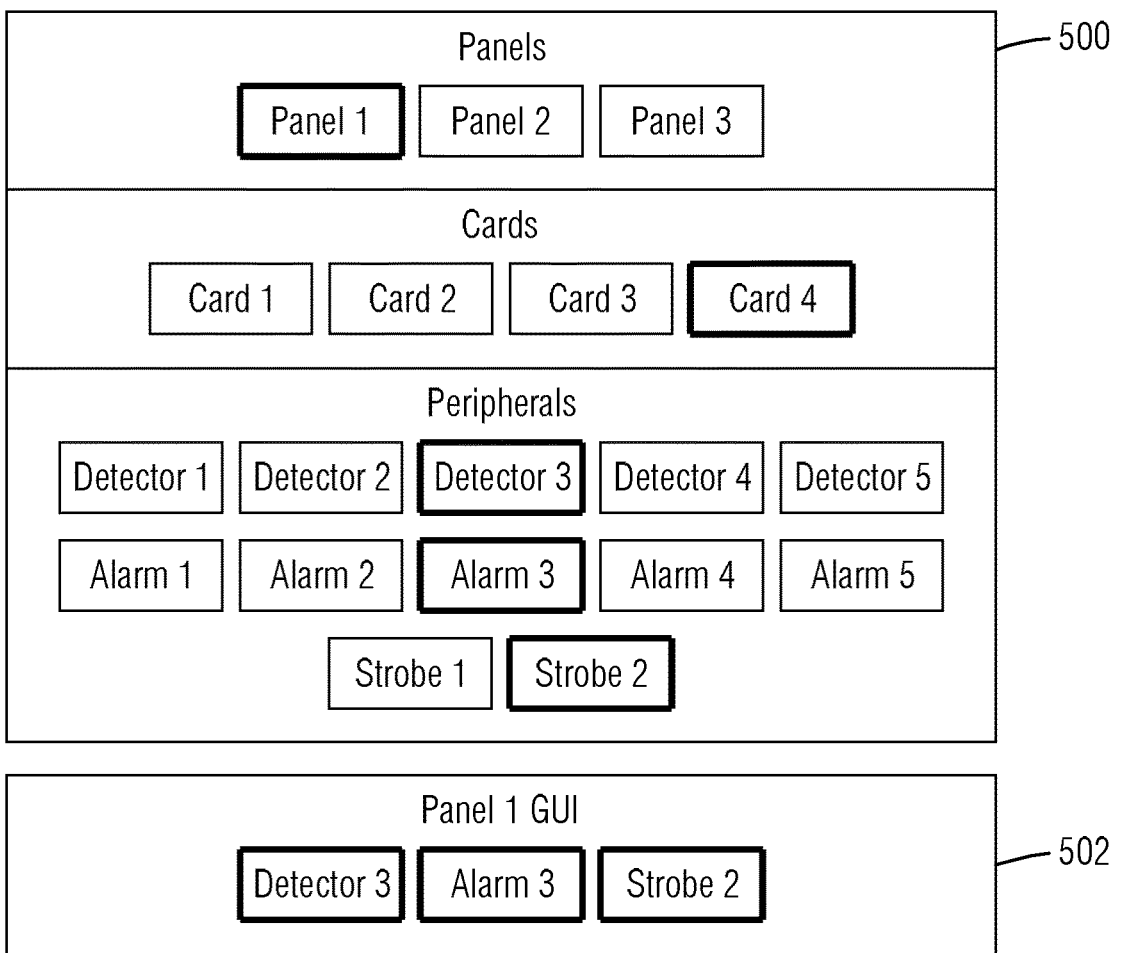
FIG. 5 shows one embodiment of a display of a simulated configuration.

FIG. 5 shows an example where the display 210 shows an image of one or more graphic user interfaces of one or more components in the simulation. The image shows the graphics user interface 502 for the panel (Panel 1 GUI) separately from the graphics user interfaces (e.g., 500) for other components, representing the firmware 202 being run separately from the simulated components. The graphics user interface 500 for the simulator 204 includes a list of icons for the panels, cards, sub-modules, and peripherals of the fire system. The cards and/or peripherals shown are for a selected panel (e.g., Panel 1 selected as represented by bold lines). The peripherals shown are for a selected card of the selected panel (e.g., Card 4 selected as represented by bold lines). Where communications are being simulated, the peripherals involved in the communication are shown, such as by colored lights, flashing, or other highlighting (e.g., detector 3 triggered resulting in alarm 3 and strobe 2 being activated as represented by the bold lines). The image may include the output emulating (e.g., the same as) output of the component as if on installed hardware, such as a flashing LED or text for an event.

The panel graphic user interface 502 (e.g., inputs and outputs on the panel 102) is emulated in the image 500. The panel graphics user interface 502 is provided as a separate image and/or is provided by the actual panel hardware. In this simplified representation, the panel 1 GUI shows that detector 3 is activated, resulting in activation of the alarm 3 and strobe 2. Other representations of the panel output provided by running the firmware may be used, such as flashing LEDs and/or text.

Figure 6:
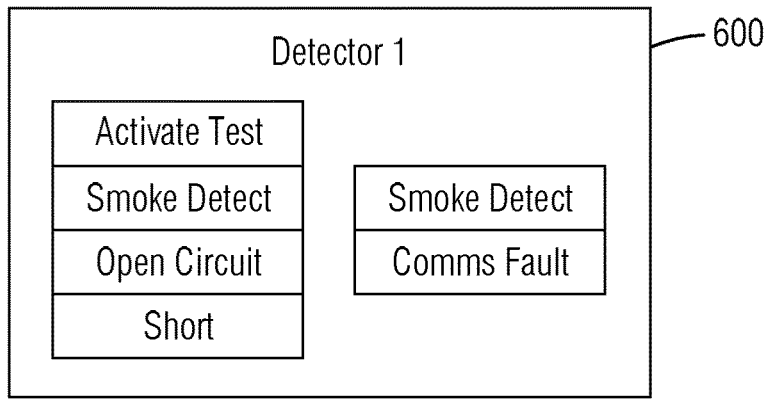
FIG. 6 shows one embodiment of a display of a simulated component.

Other information may be provided, such as lines of text indicating the identification, type, address, and/or other information for any selected component. Other images, such as separately representing each component, may be used. FIG. 6 shows an example image for a component. FIGS. 7-13 show embodiments of various graphic user interfaces provided for the simulator 204.

Figure 9A:
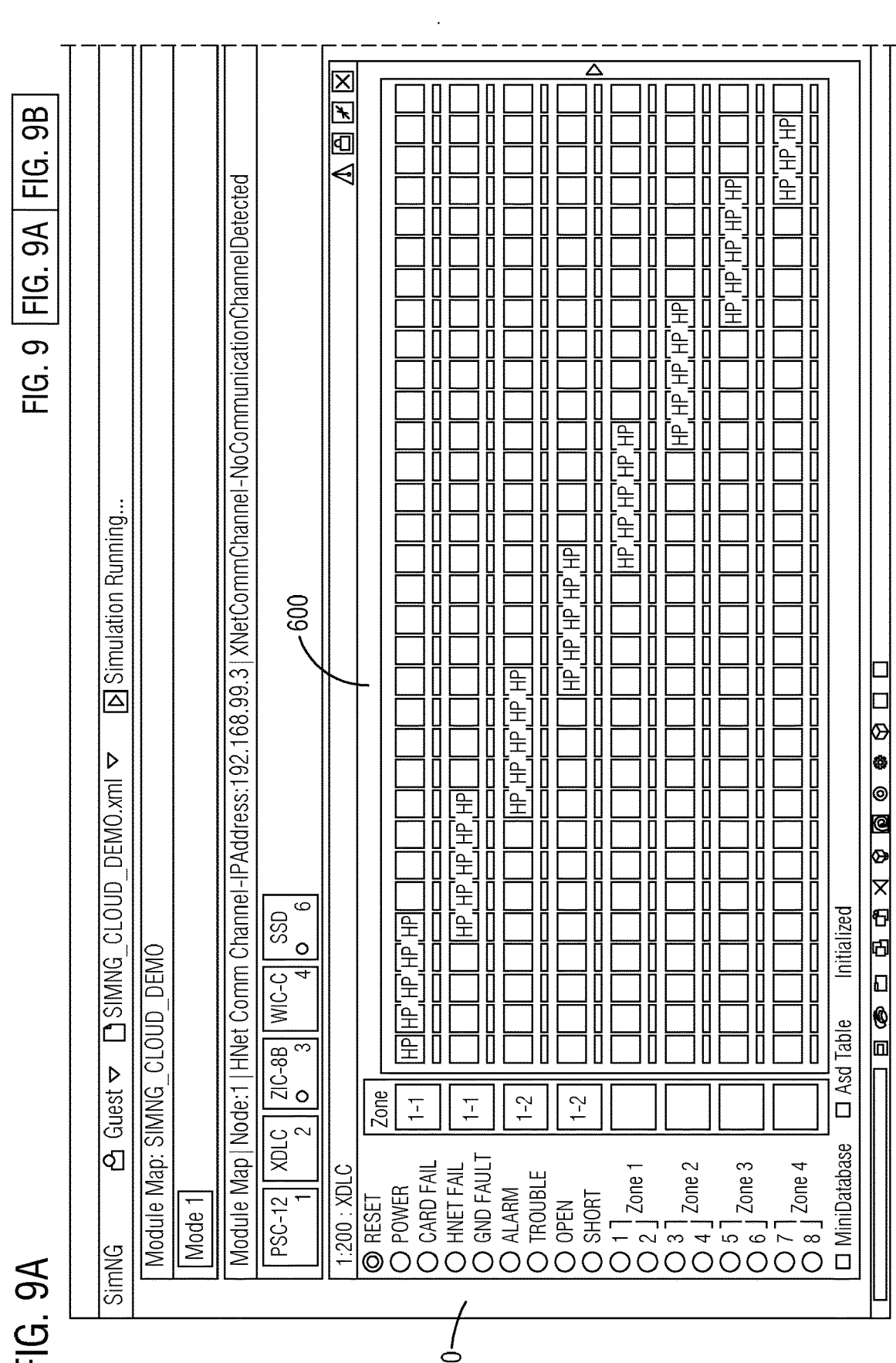
Figure 9B:
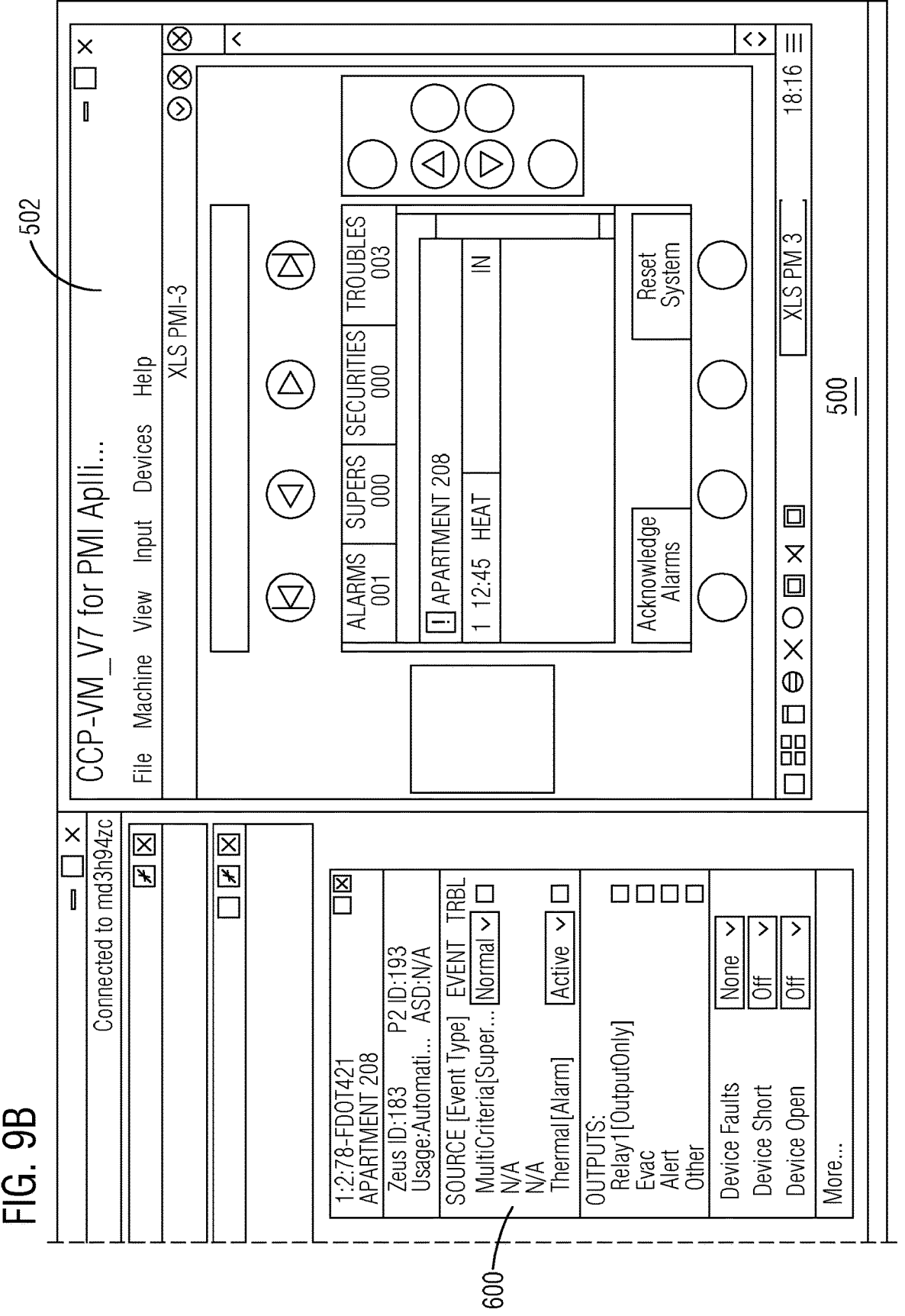

FIG. 6 shows an example image showing a representation of the graphics user interface 600 of a detector (e.g., detector 1, see also FDOT421 simulator GUI 600 in FIG. 9 (including FIGS. 9A and 9B)). The image represents the outputs and inputs of the detector hardware itself, of computer control available for the detector hardware, and/or for the simulation model different than any available for the detector itself. The inputs and/or outputs available for the detector are listed, such as a list of communications to output. Status, version, and/or other information (e.g., voltage, current, log, etc.) may also be displayed. In the example of FIG. 6, the options for events for which an output is generated include activating a test, smoke detection, an open or short circuit (e.g., as if hardware is damaged or there is a customer installation issue). The output displays at the detector include smoke detection and communications faults, such as by text or a labeled LED or flash code. Additional, different, or fewer options may be provided. The user or an automated program may select one or more of the events to activate a communication in the simulation from the detector.

Figure 7:
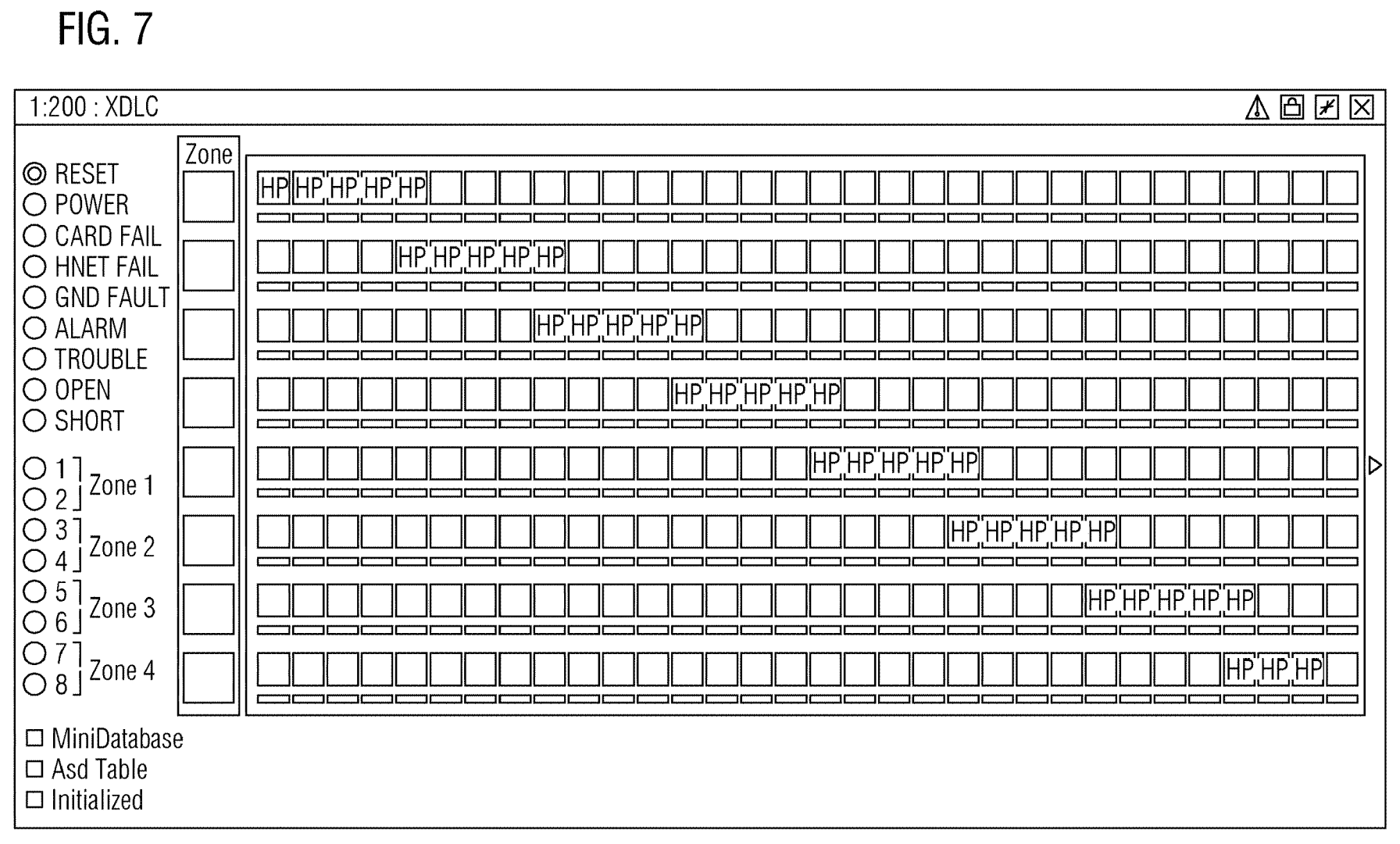

FIG. 7 shows an example XDLC interface image. The XDLC is a device line card that provides for zone connections to various peripherals (e.g., detectors, pull stations, monitoring points). The XDLC interface image represents a graphics user interface for the card and simulates aspects of the XDLC device line card (e.g., peripherals by zone). In the image, clicking on one of the small squares in a zone will open the device details for that address (e.g., graphics user interface 600 of FIG. 6).

FIG. 8 shows an example ZIC-4A interface image. The ZIC-4A is a Zone Indicating Card (e.g., peripheral between a card or panel and another peripheral (e.g., Bell, Horn, Strobe)). The ZIC-4A interface image simulates Notification Appliance Circuits (NAC) available on the module. In the image, the ZIC is shown with checkboxes corresponding with user selectable events and zone division of the configuration as well as status indicators (e.g., labeled LEDs).

Other images representing the graphic user interface of the actual hardware and/or representing the component handled by the simulation may be provided. Various types of information, such as events, serial numbers, connections, addresses, etc. may be represented.

FIG. 9 (including FIGS. 9A and 9B) shows an example of the graphics user interface 500 of the simulator 204 and the graphics user interface 502 of the firmware 202 (see FIG. 5). In the example of FIG. 9, an alarm for a simulated communication is shown on the graphics user interface 500 of the simulator 204 with one of the boxes of the peripherals highlighted. The graphics user interfaces 600 for that highlighted peripheral and the XDLC card are also shown with the operational information regarding the communication. The resulting display on the graphics user interface 502 of the panel 102 is shown. This shows the graphic user interface 500 of the simulator 204 and the graphic user interface 502 as a FS20M panel presented as a cloud application. The FS20M system firmware is executing in a virtual environment. The XDLC (device line card) is a module that hosts smoke detectors, pull stations, and other initiating devices. The smoke detector FDOT421 is shown in alarm at apartment 208. The FS20M system (e.g., panel GUI 502) is virtually indicating the alarm condition on the fire panel at apartment 208.

Figure 10B:
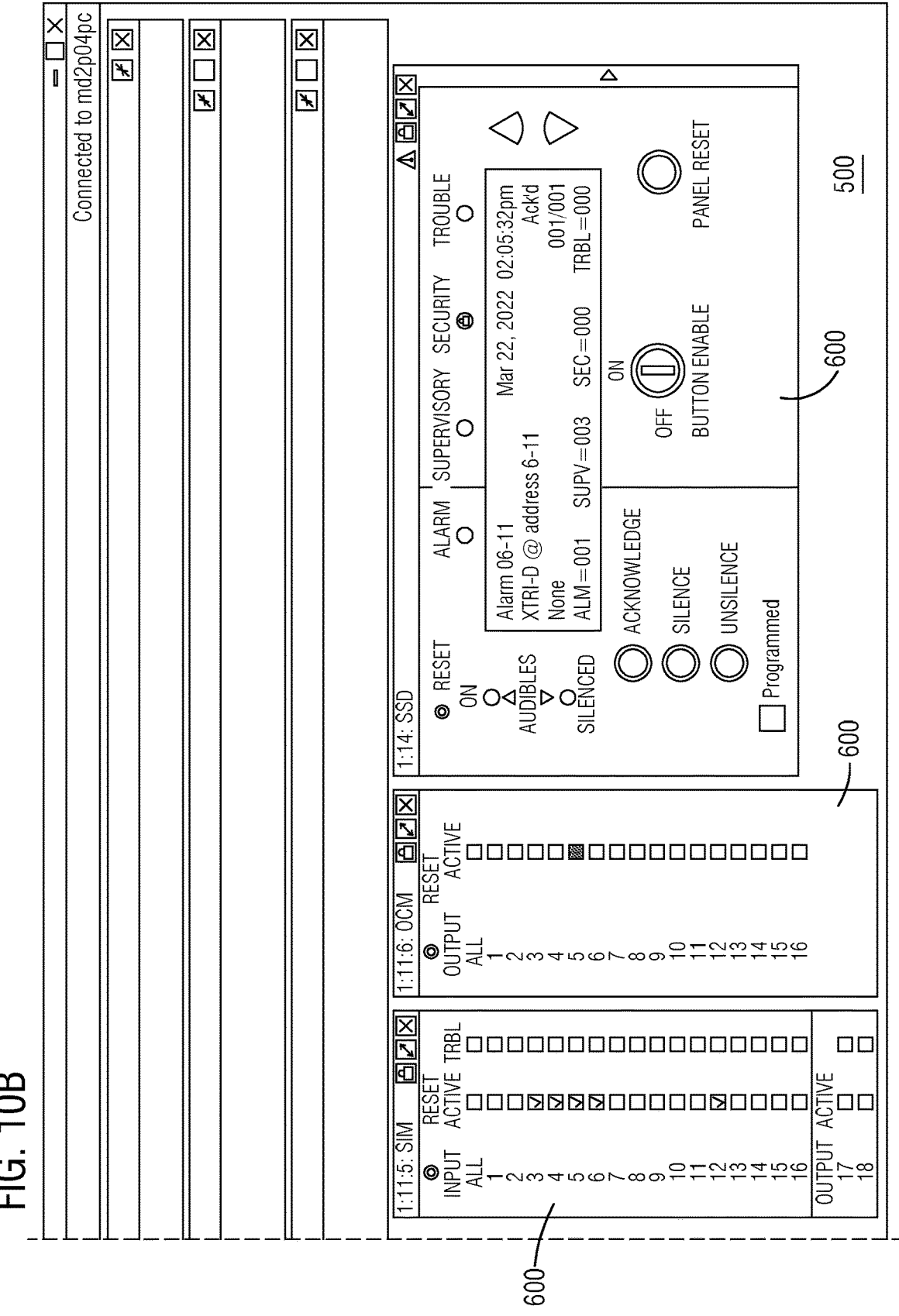

FIG. 10 (including FIGS. 10A and 10B) shows a view of the graphics user interface 500 of the simulator 204. The panel, cards, and sub-modules are shown as boxes or icons. Graphics user interfaces 600 for selected components (e.g., sub-modules of two SCM-8s (switch control module), one LCM-8 (LED control module), one SIM (supervised input module), one OCM (output control module), and one SSD (system status display)) are shown as part of the graphics user interface 500 of the simulator 204. The operation and communication options for the sub-modules are displayed. This view shows a representation of some of the simulated sub-modules as shown in the sub-module map. The SCM and LCM are representative of their physical counter parts. The SIM and OCM are hardware modules, so the graphics user interfaces 600 have a function view different than the actual modules.

FIG. 11 shows an example graphics user interface 500 of the simulator 204 for configuration set-up. A drop-down, browsing, or other input is provided to identify or select the configuration to be imported. Naming and other inputs may be provided. This view illustrates the setting of properties to configure the system before the simulation is started. Many of the configuration items are filled-in automatically.

Figure 12A:
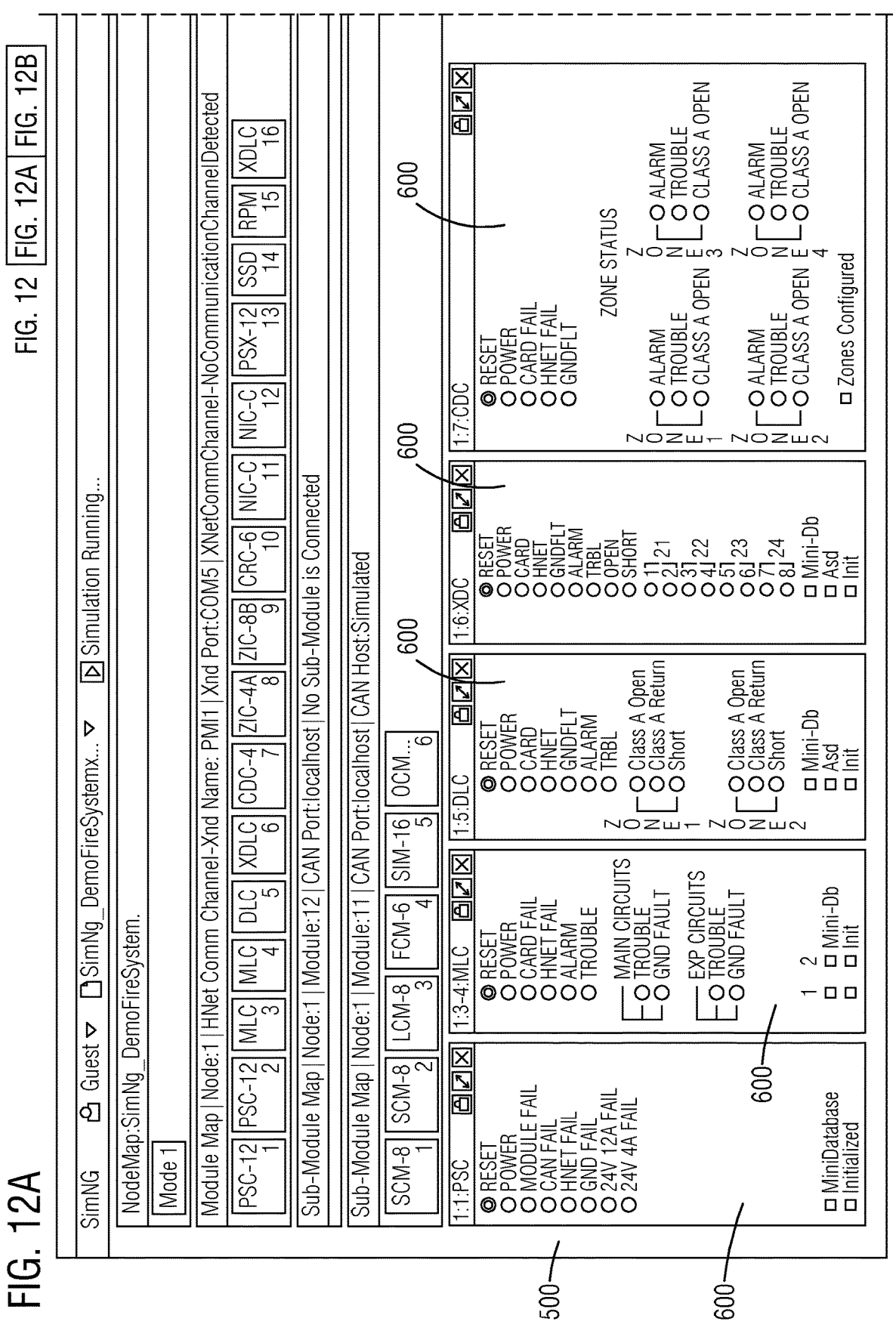
Figure 12B:
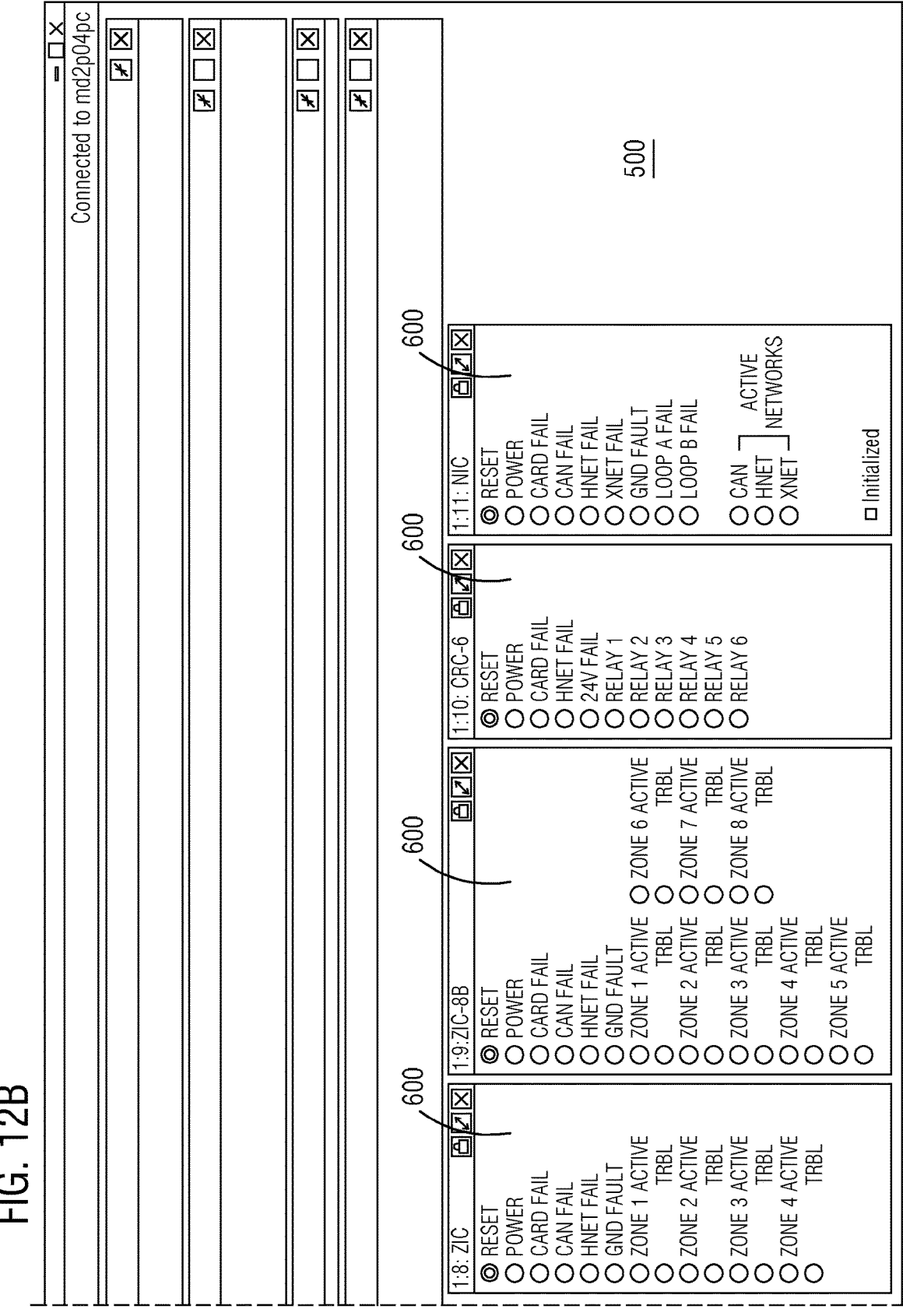

FIG. 12 (including FIGS. 12A and 12B) shows an example of the collapsed view graphics user interface 500 where graphic user interfaces 600 for various sub-modules (e.g., switching modules between the cards and other peripherals) are represented. In this example, the modules are a PSC-12 (power supply card), MLC (legacy detector line card), DLC (detector line card), XDLC (detector line card), CDC-4 (conventional detector card), ZIC-4A (zone indicating card), ZIC-8B (zone indicating card), CRC-6 (controllable relay module) and NIC-C (network interface card). This view illustrates the collapsed view of the modules in this configuration. The collapsed view is a realistic view of the modules as they would appear in the card cage with the appropriate indicators (e.g., LEDs and labels).

FIG. 13 (including FIGS. 13A and 13B) shows an example with the graphic user interface 500 for the simulator 204 including graphics user interfaces 600 for the XDLC, XTRI, ZIC-4A, and SSD sub-modules. This view illustrates an active alarm on a XTRI (switch input type device). The device is configured to be on the XDLC (detector line card—address 6) and the device has an address of 11. The ZIC-4A (zone indicating card) is indicating that a bell is active on Zone 1, and the SSD (system status display) is showing an alarm at XTRI-D at address 6-11. The small dot in the module map at address 8 indicates there is an active zone, in this case Zone 1.

The simulator 204 replaces installed hardware by simulating missing, uninstalled, replaced, or shut down components of the fire safety system. The simulation may be used for various purposes, as discussed herein. For example, logs of an installed fire safety system may be accessed. The entire fire safety system or relevant parts associated with logged events of interest are simulated while executing the firmware for the panel in the simulation. By playback of the logs from a customer site via the cloud, technical support teams may be assisted in reproducing bugs, problems, and providing the ability to provide faster high-quality field support. The simulation, whether for an installed system or not, may be used as a trouble shooting tool. Scenarios may be recreated from or for sites to investigate issues. Random or systematic testing, log based, or user selected events (e.g., alarms, troubles, etc.) may be used to activate communications in the simulation to confirm expected results.

In one embodiment, the simulation is for the one or more components that are unavailable for installation. For example, a panel, firmware version, card, sub-module, and/or peripheral may no longer be produced or is otherwise unavailable. This product may still be simulated, such as to prevent fault notices, alarms, or other events.

In another embodiment, the simulation is of communication corresponding to a hardware fault. Rather than destroying or altering hardware, the simulation of hardware faults (e.g., short, or open circuit) is provided. Difficult or impossible faults on physical hardware without damage may be simulated to test responsiveness or appropriate action by the fire safety system.

The simulation may be used for system validation. Pretesting that needs to be done is simplified. Some testing can be done before equipment and labor are obtained using the simulation. Testing networks, logic, and device configuration may be performed using simulation. Validation is provided when expansions or changes are made or are to be made to a site. For example, a designer, commissioning engineer, and/or authorizing authority test using the "digital twin" of fire system (i.e., the simulation). The simulation may be used for logic approval prior to installation. Installers may pre-test the configuration and debug before hardware is installed. Configuration problems may be corrected, and/or hardware requirements verified.

The simulation may be used for engineering support for the site configuration. A fire system operator, commissioning engineer, tech support, and/or research and development engineer may access logs for an installed fire system. The simulation plays back the log event or events of interest from the fire safety system to reproduce bugs and provide for alteration or fixes. For example, the log from a system with a failure is acquired. The simulation plays back the event or events related to the failure. After debugging, a solution is created. The solution is tested using the simulation. The installed fire safety system may then be updated.

The simulation may be used for phased construction or installation. A partial digital system (simulation) is connected to a site in progress. In this partial installation, installed components (nodes, modules, sub-modules) link to the simulator (e.g., cloud services). The simulator simulates all missing or uninstalled components. As hardware is installed, the real system under test will not display faults for missing hardware due to the simulation. For example, an installer, designer, commissioning engineer, facility owner, and/or authorizing authority create or access the configuration and install one or more components virtually. The entire configuration may be used, where the virtual components are removed as the actual components are installed. Diagnostic time may be reduced because only new hardware related defects introduced during installation will show up as a defect.

The simulation may be used as a troubleshooting tool. Scenarios from sites may be recreated to investigate issues. Tech support, research, and development engineer, and/or designer creates a failure mode using the simulation for debugging, creating a solution, testing the solution, and releasing the update for use to relevant customers.

The simulation may be used for automated operation testing. Tech support, engineers, authorizing authority, salespeople, and/or others may demonstrate operation and/or test for approval. A sequence of events may be tested, such as using a test automation built into the simulator. The simulator may be used by a potential purchaser and/or salespeople to demonstrate operation. Scalability may be tested without requiring installation of hardware.

Figure 14:
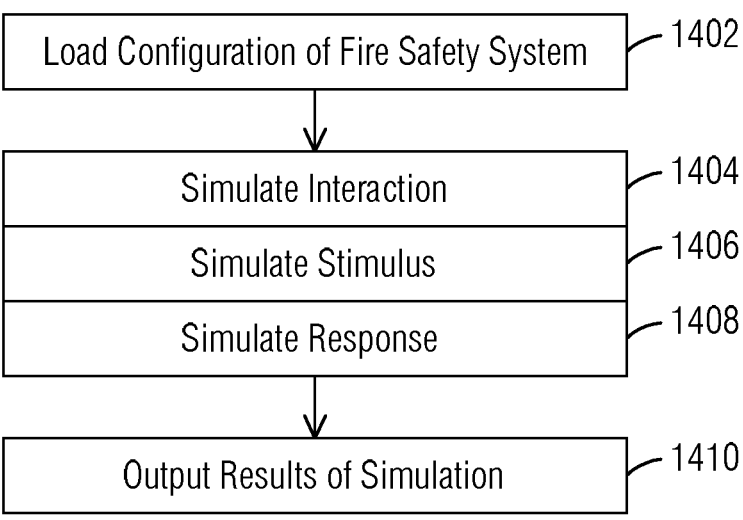
FIG. 14 shows a flow chart diagram of one embodiment of a method for testing a fire safety system.

FIG. 14 shows one embodiment of a method for testing a fire safety system. The simulation is used to test, such as testing for debugging, design, configuration approval, partial installation, and/or other purposes. Any of the uses of the simulation discussed above may be provided.

The method is implemented in the order shown or another order. Additional, different, or fewer acts may be provided. For example, simulation is provided in act 1404 based on an existing configuration so act 1402 is not performed. In another example, acts 1406 and/or 1408 are not provided, such as where the fire safety system itself provides the stimulus or outputs results of the stimulus. As another example, acts for using the results of the simulation, including repeating of the loading, simulation, and/or output acts are provided.

The method is implemented by a panel, computer, processor, server, or combinations thereof. Other hardware, such as installed components of the fire safety system, may be used to implement the method.

In act 1402, a configuration of the fire safety system is loaded. For example, the user connects their computer to a fire alarm control panel through an XND module, ethernet port, or via a computer network (e.g., via a cloud connection). The user loads the configuration file through the interface. The panel is configured based on the configuration file. Similarly, the simulator is configured by the configuration file.

The simulator and/or the user may establish connections between existing hardware and the simulator as needed. For example, a port or ports of an interface of the panel or cards are re-routed to connect with the simulator for particular components to be simulated. This arrangement allows for the panel or firmware for a panel to think or operate as if a fully functional set of hardware components are connected.

In act 1404, the processor implementing the simulator simulates interaction between parts of the fire safety system based on the configuration. Firmware of a panel of the fire safety system may be one of the parts in the simulation. Alternatively, an installed panel is used so the firmware operating on the installed panel is a part.

Communications of any parts not installed are simulated. An entirety of the fire safety system may be represented virtually, so the simulation is of all the parts. The panel and/or other parts may be installed. The communications form uninstalled or not operating parts are simulated and provided to or from the installed parts of the building. For example, the panel and components for one or more floors and/or a partial floor are installed. The simulation is of other parts. Alternatively, the simulation is of a part being replaced or tested.

In a cloud-based simulation, modules, nodes, sub-modules, and/or other components from the configuration appear in the simulator's browser interface. The user can then simulate events and receive feedback from the fire system.

In one embodiment, the simulation automatically tests the configuration. Test automation of normal operation may be provided. System validation or pre-testing may be provided. The testing may initiate events and query device states based on the events. The testing is automated, such as using programming to trigger various communications to see the results on the graphics user interface or in logs. Alternatively, or additionally, the testing is manual where a user triggers an event using the graphics user interface. With physical modules, it is difficult to create most events on demand. Simulation allows almost any event on demand. Logs generated from the simulation may be reviewed.

In act 1406, the interaction being simulated is a stimulus. For example, smoke detection is simulated. In act 1408, the interaction being simulated is a response to a stimulus. For example, an alarm is simulated. Both stimulus and response may be simulated. Either of acts 1406 or 1408 may be performed by the fire safety system itself. For example, the detector is simulated so act 1406 is performed by the simulator, and the fire safety system (e.g., panel and bell) output the response.

In act 1410, results of the simulation are output. The results may be output on the graphics user interface, panel, or another output. For example, a log file is output. As another example, a list of events and results are output. In one embodiment, the graphics user interface or interfaces of the simulator are the output, such as showing a trigger event and responses of the fire safety system (see FIG. 5, 9, or 13). Representations of various graphic user interfaces of simulated and/or actual components may be output. The simulation may simulate the graphics user interface of the panel as the output, or the panel itself provides the output (as a display on the panel).

Various improvements described herein may be used together or separately. Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. An arrangement system for service to a fire safety system, the arrangement system comprising:
a memory configured to store a configuration of the fire safety system, the configuration of the fire safety system including a panel and one or more installed components for one or more floors and one or more not installed components for one or more other floors;
a processor configured to simulate communication of the one or more installed and not installed components for each floor by linking a simulator, wherein execution of firmware of the panel includes handling of the simulated communication by the panel with actual installed components, wherein the processor is configured to execute the firmware of the panel without hardware of the panel, all of the fire safety system represented in the simulation; and
a display configured to display resulting actions in the handling of the simulated communication with the actual installed components.

2. The arrangement system of claim 1 wherein the firmware for the panel comprises firmware operable on hardware of the panel as installed and wherein the communication of the one or more components is simulated without operation of firmware for the one or more components.

3. The arrangement system of claim 1 wherein the processor is configured to load the configuration where the simulation is a test of the configuration including logic for operation of the fire safety system.

4. The arrangement system of claim 1 further comprising the panel, the panel configured to execute the firmware separately from the simulator.

5. The arrangement system of claim 1 wherein the configuration of the fire safety system comprises a design configuration from fire safety system configuration software.

6. The arrangement system of claim 1 wherein the processor is configured to cause display on the display of one or more graphic user interfaces of the one or more components, respectively, in the simulation, the graphic user interfaces representing the communication.

7. The arrangement system of claim 1 wherein the processor comprises a cloud server and the display is remote from the cloud server.

8. The arrangement system of claim 1 wherein the processor is configured to simulate the communication based on logs of installed parts of the fire safety system.

9. The arrangement system of claim 1 wherein the simulation is for the one or more components that are unavailable for installation.

10. The arrangement system of claim 1 wherein the simulation is of communication corresponding to a hardware fault, the hardware fault being simulated to test responsiveness or appropriate action by the fire safety system.

11. The arrangement system of claim 1 wherein the simulation includes a network of the fire safety system.

12. A fire safety system comprising:
a panel installed in a building and executing panel firmware;
one or more first components installed for one or more floors and connected with the panel;
one or more second components not installed for one or more other floors;
a processor configured to simulate communication of the one or more first and second components for each floor by linking a simulator, wherein execution of firmware of the panel includes handling of the simulated communication by the panel with actual installed components, wherein the processor is configured to execute the firmware of the panel without hardware of the panel, all of the fire safety system represented in the simulation;
wherein the panel operates in response to the one or more first components and in response to the simulation of the one or more second components; and
a display configured to display resulting actions in handling of the simulated communication with the actual installed components.

13. The fire safety system of claim 12 wherein the processor comprises a cloud server.

14. The fire safety system of claim 12 wherein the panel operates as if the one or more second components are installed due to the simulation.

15. A method for testing a fire safety system, the method comprising:
loading a configuration of the fire safety system, the configuration of the fire safety system including a panel, one or more installed components for one or more floors, and one or more not installed components for one or more other floors;
simulating interaction of the one or more installed and not installed components for each floor by linking a simulator based on the configuration, wherein executing firmware handles simulated communications by the panel with actual installed components, wherein the processor is configured to execute the firmware of the panel without hardware of the panel, all of the fire safety system represented in the simulation; and
outputting resulting actions in the handling of the simulated communication with the actual installed components.

16. The method of claim 15 wherein simulating comprises simulating with firmware of a panel of the fire safety system as one of the parts and communications of others of the parts where an entirety of the fire safety system is represented virtually, and wherein outputting the results comprises outputting representations of graphic user interfaces of the others of the parts.

17. The method of claim 15 wherein a panel of the fire safety system is installed in a building, the panel being one of the parts, and wherein simulating comprises simulating communications from others of the parts with the panel, and wherein outputting results comprises outputting as a display on the panel.

18. The method of claim 15 wherein comprises automatically testing the configuration.

* * * * *